United States Patent
Um et al.

(10) Patent No.: US 10,734,595 B2
(45) Date of Patent: Aug. 4, 2020

(54) ELECTROLUMINESCENCE DISPLAY APPARATUS

(71) Applicant: LG Display Co., Ltd., Seoul (KR)

(72) Inventors: Hyunchul Um, Paju-si (KR); Jongchan Park, Paju-si (KR); Taewon Lee, Wonju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/430,732

(22) Filed: Jun. 4, 2019

(65) Prior Publication Data

US 2020/0203653 A1    Jun. 25, 2020

(30) Foreign Application Priority Data

Dec. 20, 2018  (KR) .......................... 10-2018-0165883

(51) Int. Cl.
    *H01L 51/52*     (2006.01)
    *H01L 27/32*     (2006.01)
    *H01L 27/12*     (2006.01)

(52) U.S. Cl.
    CPC ...... *H01L 51/5203* (2013.01); *H01L 27/1218* (2013.01); *H01L 27/3297* (2013.01)

(58) Field of Classification Search
    CPC ............. H01L 27/3258; H01L 27/3276; H01L 27/3297; H01L 51/5256; H01L 27/1218; H01L 51/5203
    See application file for complete search history.

(56) References Cited

U.S. PATENT DOCUMENTS

| | | | |
|---|---|---|---|
| 9,634,287 B1* | 4/2017 | Shin | H01L 27/3276 |
| 2008/0197778 A1* | 8/2008 | Kubota | H01L 27/3258 |
| | | | 315/73 |
| 2009/0026932 A1* | 1/2009 | Kwak | H01L 27/3272 |
| | | | 313/504 |
| 2015/0116295 A1* | 4/2015 | Pyon | G09G 3/3233 |
| | | | 345/211 |
| 2015/0187279 A1* | 7/2015 | Lee | G09G 3/3291 |
| | | | 257/40 |
| 2016/0133874 A1 | 5/2016 | Kim et al. | |
| 2017/0288008 A1* | 10/2017 | Kim | H01L 27/3279 |
| 2019/0041915 A1* | 2/2019 | Park | H05K 1/028 |
| 2019/0148469 A1* | 5/2019 | Lhee | H01L 27/3276 |
| | | | 257/40 |

FOREIGN PATENT DOCUMENTS

KR    10-2016-0055333 A    5/2016

* cited by examiner

*Primary Examiner* — Hong Zhou
(74) *Attorney, Agent, or Firm* — Morgan, Lewis & Bockius LLP

(57) ABSTRACT

An electroluminescence display apparatus includes a substrate including a display area and a non-display area. The non-display area includes a bending area and a link area. A first power supply electrode is in the link area. A second power supply electrode is in the non-display area. The second power supply electrode surrounds at least three sides of the display area, and both ends of the second power supply electrode in the link area. A protective layer covers the first power supply electrode and the second power supply electrode in the link area. A first planarizing layer covers one side of the first power supply electrode; and a second planarizing layer is on a contact hole of the protective layer that exposes the first power supply electrode and the second power supply electrode. The first planarizing layer is not on the contact hole.

20 Claims, 4 Drawing Sheets

ELECTROLUMINESCENCE DISPLAY APPARATUS

CROSS-REFERENCE TO RELATED APPLICATIONS

This application claims the priority of Korean Patent Application No. 10-2018-0165883 filed on Dec. 20, 2018, in the Korean Intellectual Property Office, the disclosure of which is incorporated herein by reference in its entirety.

BACKGROUND

Technical Field

The present disclosure relates to an electroluminescence display apparatus, and more particularly, to an electroluminescence display apparatus that reduces gases outgassed from a planarizing layer to improve reliability.

Description of the Related Art

An electroluminescence display apparatus may be a self-emitting display apparatus in which a separate light source is not necessary, unlike a liquid crystal display apparatus. Therefore, the electroluminescence display apparatus may be manufactured to be thin and lightweight. Further, because the electroluminescence display apparatus may be driven at a low voltage, it may be advantageous in terms of power consumption. Furthermore, the electroluminescence display device may be advantageous in terms of response speed, viewing angle, and contrast ratio. Thus, the electroluminescence display apparatus is being studied for use in next generation displays.

Recently, as the demands on a high resolution electroluminescence display apparatus increase, studies are carried out to densely dispose a plurality of wiring lines, a thin film transistor, a capacitor, and a light emitting element. For example, in accordance with the demand for higher resolution, a larger number of wiring lines may need to be disposed in a limited space, therefore creating a problem that an interval between wiring lines may be insufficient. Furthermore, when a width of the wiring line is reduced to dispose the larger number of wiring lines, the resistance of the wiring lines may be undesirably increased.

SUMMARY

Accordingly, the present disclosure is directed to an electroluminescence display apparatus that substantially obviates one or more problems due to limitations and disadvantages of the related art.

According to the present disclosure, a technology may apply two planarizing layers in both of a display area and a non-display area of an electroluminescence display device. The two planarizing layers in the display area and the non-display area may be applied to provide an additional space for disposing wiring lines between two planarizing layers. Therefore, wiring lines, which may have needed to be disposed on one layer, are disposed on each of two layers so that an interval between the wiring lines is designed to have a certain margin. Furthermore, the wiring lines having high resistance may be connected in parallel with the wiring line disposed between two planarizing layers to lower the wiring resistance.

Meanwhile, even though a curing process may be performed in an oven to remove a gas component of the planarizing layer, some amount of gases may still remain in the planarizing layer. When the remaining gasses are outgassed from the planarizing layer, and the gases outgassed from the planarizing layer are moved to a cathode of the light emitting element, the cathode may be oxidized, which may result in a pixel shrinkage defect.

The inventors of the present disclosure recognized that the probability of the pixel shrinkage defect as described above may be increased as the volume of the planarizing layer disposed in the non-display area is increased. Therefore, the inventors of the present disclosure invented an electroluminescence display apparatus having a new structure, which may help ensure an interval between wiring lines, maintain a low wiring resistance, and reduce gas outgassed from the planarizing layer.

An aspect of the present disclosure is to provide an electroluminescence display apparatus which applies two planarizing layers in a display area and selectively applies one planarizing layer in a non-display area to reduce a gas outgassed from the planarizing layer.

Another aspect of the present disclosure is to provide an electroluminescence display apparatus which applies a planarization pattern in a non-display area to reduce a gas outgassed from a region of a gate driver and additionally provide a space where the wiring lines are disposed.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, an electroluminescence display apparatus according to an embodiment of the present disclosure includes a substrate including a display area and a non-display area, wherein the non-display area surrounds the display area and includes a pad area, a bending area, and a link area; a plurality of thin film transistors on the substrate in the display area; a first power supply electrode on the substrate in the link area of the non-display area, wherein the link area is between the bending area and the display area; a second power supply electrode on the substrate in the non-display area; a gate driver in the non-display area and between the second power supply electrode and the display area; a protective layer covering the plurality of thin film transistors, the gate driver, the first power supply electrode, and the second power supply electrode; a first planarizing layer covering the plurality of thin film transistors and the gate driver; a second planarizing layer on the first planarizing layer in the non-display area, the second planarizing layer including a first opening that exposes a surface of the first planarizing layer in an area overlapping the gate driver; and a plurality of light emitting elements on the second planarizing layer in the display area.

According to another aspect of the present disclosure, an electroluminescence display apparatus includes a substrate including a display area and a non-display area, wherein the non-display area includes a bending area and a link area, and wherein the link area is between the display area and the bending area; a first power supply electrode in the link area of the non-display area; a second power supply electrode in the non-display area, the second power supply electrode surrounding at least three sides of the display area, and both ends of the second power supply electrode in the link area; a protective layer covering the first power supply electrode and the second power supply electrode in the link area of the non-display area; a first planarizing layer covering one side of the first power supply electrode; and a second planarizing layer on a contact hole of the protective layer that exposes the first power supply electrode and the second power supply electrode, wherein the first planarizing layer is not on the contact hole of the protective layer.

Other detailed matters of the embodiments are included in the detailed description and the drawings.

According to an example embodiment of the present disclosure, in an electroluminescence display apparatus, a planarizing layer having a double-layered structure is configured in a display area so that an interval between wiring lines and a wiring resistance in the display area may be freely designed.

Further, according to an example embodiment of the present disclosure, in an electroluminescence display apparatus, a planarizing layer having a double-layered structure is used and a planarizing layer having a single layer structure is selectively used in the non-display area so that a volume of the planarizing layer from which the gas component is outgassed may be reduced.

Further, according to an example embodiment of the present disclosure, in an electroluminescence display apparatus, a gas component outgassed from the planarizing layer is minimized so that the oxidation of the cathode of the light emitting element may be reduced and the reliability of the electroluminescence display apparatus may be improved.

It is to be understood that both the foregoing general description and the following detailed description of the present disclosure are example and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
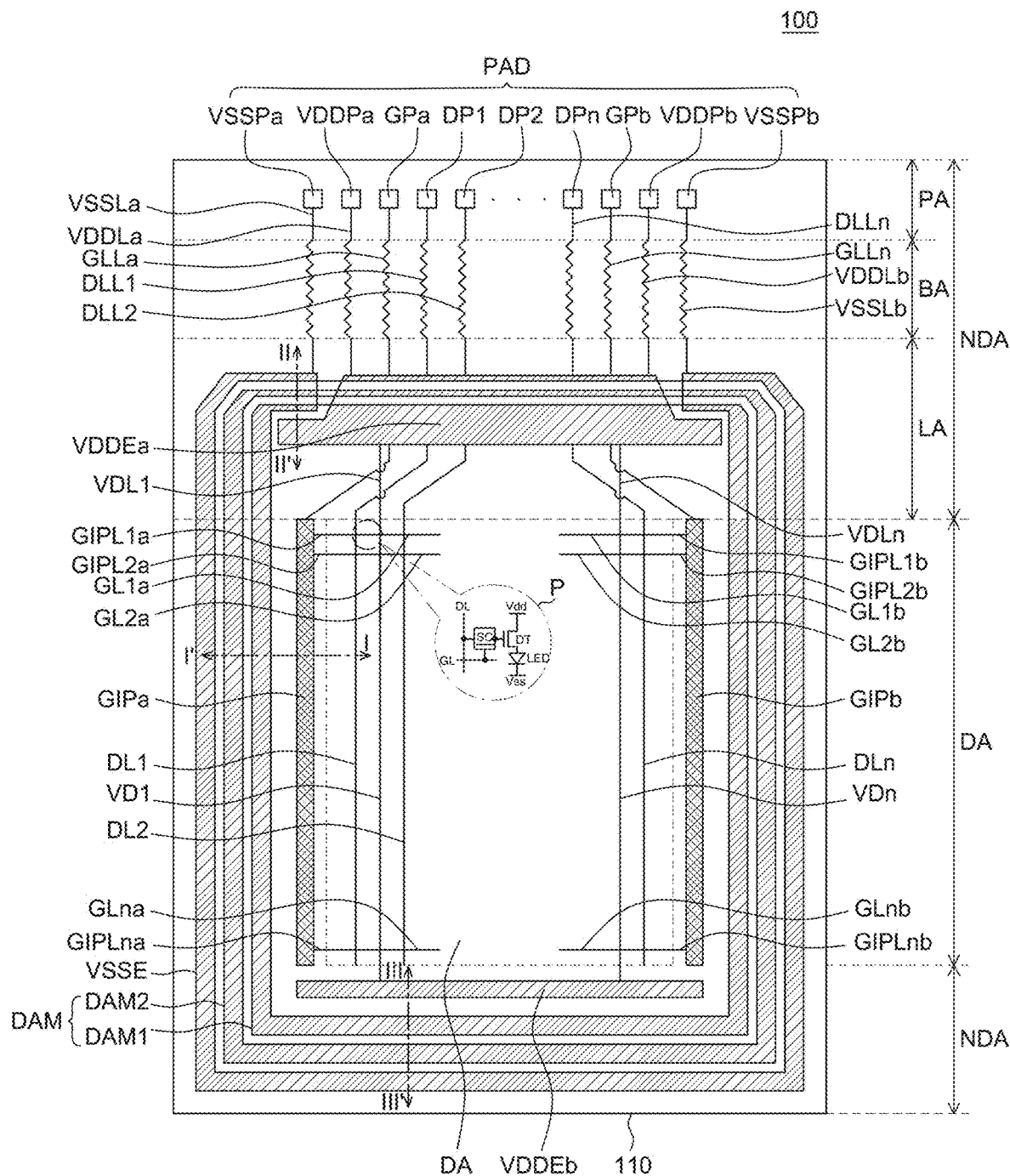
FIG. 1 is a plan view of an electroluminescence display apparatus according to an embodiment of the present disclosure.

Reference will now be made in detail to the example embodiments of the present disclosure, examples of which are illustrated in the accompanying drawings. Wherever possible, the same reference numbers will be used throughout the drawings to refer to the same or like parts. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

The shapes, sizes, ratios, angles, numbers, and the like illustrated in the accompanying drawings for describing the exemplary embodiments of the present disclosure are merely examples, and the present disclosure is not limited thereto. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly" is not used.

When an element or layer is disposed "on" another element or layer, it means that another layer or another element may be disposed directly on the other element or a third part may be interposed therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals indicate like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely bonded to or combined with each other and can be interlocked and operated in technically various ways understood by those skilled in the art, and the embodiments can be carried out independently of or in association with each other.

Hereinafter, various exemplary embodiments of the present disclosure will be described in detail with reference to accompanying drawings.

FIG. 1 is a schematic plan view of an electroluminescence display apparatus according to an embodiment of the present disclosure. With reference to FIG. 1, the display apparatus 100 includes a display area DA, which displays information and a non-display area NDA, in which information is not displayed.

The display area DA is an area where input images are displayed and a plurality of pixels is disposed in a matrix. The non-display area NDA may include a pad area PA in which a pad unit is disposed, a bending area BA in which a substrate 110 is bent, and a link area LA.

The link area LA may be disposed between the display area DA and the bending area BA. The link area LA is an area where link lines for transmitting signals to wiring lines disposed in the display area DA are disposed, and various link lines may be disposed therein. For example, gate link lines GLLa and GLLb (hereinafter, referred to as GLL), data link lines DLL1 to DLLn (hereinafter, referred to as DLL), first power link lines VDDLa and VDDLb (hereinafter, referred to as VDDL), first power supply lines VDL1 to VDLn (hereinafter, referred to as VDL), and second power link lines VSSLa and VSSLb (hereinafter, referred to as VSSL) may be disposed in the link area LA. The link lines may also be disposed in the bending area BA and the pad area PA, and may be connected to the pads PAD of the pad area PA.

The bending area BA may be an area where the substrate 110 is bent. The bending area BA may be disposed between the link area LA and the pad area PA. The substrate 110 may be maintained to be flat without being bent in an area except for the bending area BA, where the substrate 110 is bent. Therefore, the display apparatus 100 may be bent such that portions of the substrate 110 in two non-bending areas excluding the bending area BA face each other.

The pad area PA is an area in which no image is displayed and a plurality of pads is formed. The pad area PA may be an area extending from one side of the bending area BA. The pad area PA may be an area where pads PAD are disposed. For example, first power supply pads VDDPa and VDDPb (hereinafter, referred to as VDDP), data pads DP1 to DPn (hereinafter, referred to as DP), gate pads GPa and GPb (hereinafter, referred to as GP), and second power supply pads VSSPa and VSSPb (hereinafter, referred to as VSSP) may be disposed.

In the non-display area NDA, gate drivers GIPa and GIPb (hereinafter, referred to as GIP) of a gate driving circuit, gate voltage supply lines GIPL1a to GIPLna: GIPLa, and GIPL1b to GIPLnb: GIPLb (hereinafter, referred to as GIPL), a second power supply electrode VSSE, and first power supply electrodes VDDEa and VDDEb (hereinafter, referred to as VDDE), and dams DAM1 and DAM2 (hereinafter, referred to as DAM) may be disposed.

In the display area DA, data lines DL1 to DLn (hereinafter, referred to as DL), and gate lines GL1a to GLna: GLa, and GL1b to GLnb: GLb (hereinafter, referred to as GL) are disposed to intersect each other. Pixels P, which are disposed in a matrix, may be included at every intersection area.

Each pixel P may include a light emitting element LED (such as an organic LED), a driving thin film transistor (hereinafter, referred to as a driving TFT) which controls a current amount flowing into the light emitting element LED, and a programming unit SC for setting a gate-source voltage of the driving TFT (DT). The pixels P of the display apparatus 100 may be supplied with a first power Vdd, which is a high potential voltage, through the first power lines VD1 to VDn (hereinafter referred to as VD) connected to the first power supply electrode VDDE disposed in the non-display area NDA, and supplied with a second power Vss, which is a low potential voltage, through the second power supply electrode VSSE.

The first power line VD may be supplied with the first power Vdd through the first power supply electrode VDDE disposed in the non-display area NDA. The first power Vdd supplied through the first power supply electrode VDDE may be supplied to the first power line VD disposed in the display area DA through the first power link line VDDL. For example, the first power Vdd may be supplied to the first power supply pad VDDP of the pad area PA. The first power Vdd supplied to the first power supply pad VDDP may be supplied to a 1a power supply electrode VDDEa of the link area LA through the first power link line VDDL, and the first power Vdd supplied to the 1a power supply electrode VDDEa may be supplied to the first power line VD of the display area DA through the first power supply line VDL of the link area LA. One side of the first power line VD is connected to the 1a power supply electrode VDDEa, and the other side of the first power line VD is connected to a 1b power supply electrode VDDEb.

The 1a power supply electrode VDDEa may be disposed between the bending area BA and the display area DA. The 1b power supply electrode VDDEb may be disposed to be opposite to the 1a power supply electrode VDDEa with the display area DA therebetween. Thicknesses of both ends of the 1a power supply electrode VDDEa may be smaller than a thickness of a center portion of the 1a power supply electrode VDDEa. Both ends of the 1a power supply electrode VDDEa may be disposed between the second power supply electrode VSSE and the display area DA. For example, the 1a power supply electrode VDDEa may include a first area having a first line width and a second area which is larger than the first line width. The first area may include both ends of the 1a power supply electrode VDDEa, and the second area may include a center portion of the 1a power supply electrode VDDEa.

The second power Vss may be supplied to the second power link line VSSL of the non-display area NDA through the second power supply pad VSSP of the pad area PA. The second power Vss supplied to the second power link line VSSL may be supplied to the pixel P of the display area DA through the second power supply electrode VSSE. For example, the second power Vss may be supplied to a 2a power link line VSSLa and a 2b power link line VSSLb of the second power link line VSSL connected to the second power supply pad VSSP located in the pad PAD. Further, the second power Vss supplied to the 2a power link line VSSLa and the 2b power link line VSSLb of the second power link line VSSL may be supplied to the pixel P of the display area DA through the second power supply electrode VSSE. The 2a power link line VSSLa of the second power link line VSSL may be connected to one side of the second power supply electrode VSSE to supply the second power Vss. The 2b power link line VSSLb of the second power link line VSSL may be connected to the other side of the second power supply electrode VSSE to supply the second power Vss.

With reference to FIG. 1, in the non-display area NDA, the second power supply electrode VSSE may be disposed to surround at least three sides of the display area DA. Both ends of the second power supply electrode VSSE may be disposed in the link area LA to face each other. Further, in the link area LA, one end of the 1a power supply electrode VDDEa having a first line width which is smaller than a second line width may be disposed between one end of the second power supply electrode VSSE and the display area DA. In the link area LA, the other end of the 1a power supply electrode VDDEa having a first line width may be disposed between the other end of the second power supply electrode VSSE and the display area DA.

In the link area LA, one end of the second power supply electrode VSSE and one end of the 1a power supply electrode VDDEa may be disposed to be spaced apart from each other. A protective layer is disposed in a space formed by one end of the second power supply electrode VSSE and one end of the 1a power supply electrode VDDEa, which are spaced apart from each other to be insulated. Further, with reference to FIG. 3, on the protective layer 114, a second planarizing layer 117 is disposed to be in direct contact with an upper surface of the protective layer 114.

The programming unit SC may include at least one switching TFT and at least one storage capacitor. The switching TFT is turned on in response to a scan signal from the gate lines GL to apply a data voltage from the data lines DL to one electrode of the storage capacitor. The driving TFT DT may control a current amount supplied to the light emitting element LED in accordance with a magnitude of the voltage charged in the storage capacitor to control an emission amount of the light emitting element LED. The emission amount of the light emitting element LED may be proportional to a current amount supplied from the driving TFT DT. Further, a semiconductor layer of TFTs which configures a pixel P may include at least one of amorphous silicon, polysilicon, and an oxide semiconductor material. The light emitting element LED may include an anode electrode, a cathode electrode, and an emission structure interposed between the anode electrode and the cathode electrode. The anode electrode may be connected to the driving TFT DT. The emission structure may include an emission layer EML, a hole injection layer HIL and a hole transport layer HTL disposed at one side of the emission layer, and an electron transport layer ETL and an electron injection layer EIL disposed at the other side.

The data voltage may be supplied to the data link line DLL of the non-display area NDA through the data pad DP of the pad area PA. The data voltage supplied to the data link line DLL may be supplied to the data line DL of the display area DA.

The gate driving voltage may be supplied to the gate link line GLL of the non-display area NDA through the gate pad GP of the pad area PA. The gate driving voltage supplied to the gate link line GLL may be supplied to the gate driver GIP. The gate driving voltage may be supplied to the gate line GL of the display area DA through the gate voltage supply line GIPL connected to the gate driver GIP. The gate driving voltage may include a gate high voltage VGH and a gate low voltage VGL. The gate driver GIP may also be supplied with signals such as a start pulse, gate shift clocks, and a flicker signal, as well as the gate driving voltage. The start pulse, the gate shift clocks, and the flicker signal may swing between approximately 0 V and 3.3 V. The gate shift clocks may be n-phase clock signals having a predetermined phase difference. The gate high voltage VGH is a voltage higher than a threshold voltage of a thin film transistor TFT formed in a thin film transistor array of the display apparatus 100, and may be approximately 28 V. The gate low voltage VGL is a voltage lower than a threshold voltage of a thin film transistor TFT formed in a thin film transistor array of the display apparatus 100, and may be approximately −5 V, but is not limited thereto.

The gate driver GIP may include a first gate driver GIPa disposed adjacent to a left side of the display area DA and a second gate driver GIPb disposed adjacent to a right side of the display area DA. The first gate driver GIPa may be supplied with the gate driving voltage through the first gate link line GLLa of the gate link line GLL. The second gate driver GIPb may be supplied with the gate driving voltage through the second gate link line GLLb of the gate link line GLL. Further, the gate driving voltage supplied to the first gate driver GIPa may be supplied to the first gate line GL1a to GLna (hereinafter, referred to as GLa) of the gate line GL through the first gate voltage supply line GIPL1a to GIPLna (hereinafter, referred to as GIPLa) of the gate voltage supply line GIPL. Further, the gate driving voltage supplied to the second gate driver GIPb may be supplied to the second gate line GL1b to GLnb (hereinafter, referred to as GLb) of the gate line GL through the second gate voltage supply line GIPL1b to GIPLnb (hereinafter, referred to as GIPLb) of the gate voltage supply line GIPL.

The gate driver GIP may be disposed between the second power supply electrode VSSE and the display area DA. FIG. 1 illustrates that the gate driver GIP is disposed to be adjacent to both sides of the display area DA to supply a gate pulse from both ends of the display area DA to the gate line GL. However, the present disclosure is not limited thereto. The gate driver may be disposed to be adjacent to only one side of the display area DA so that one side of the display area DA may supply the gate pulse to the gate line GL. When the gate driver GIP is disposed on both sides of the outside of the display area DA, a gate pulse having the same phase and the same amplitude may be supplied to the pixel P disposed on the same horizontal line through the gate line GL.

A dam DAM may be disposed on the second power supply electrode VSSE. The dam DAM may be disposed to overlap the second power supply electrode VSSE. Further, the dam DAM is disposed to surround four sides of the display area DA to block the flow of an organic layer of an encapsulating unit disposed on the light emitting element LED of the pixel P. The dam DAM may include a first dam DAM1 and a second dam DAM2. The first dam DAM1 and the second dam DAM2 may be disposed to be spaced apart from each other, and the first dam DAM1 may be disposed between the second dam DAM2 and the display area DA.

Hereinafter, components of the display apparatus 100 according to an example embodiment of the present disclosure will be described in more detail with reference to FIGS. 2 to 4.

Figure 2:
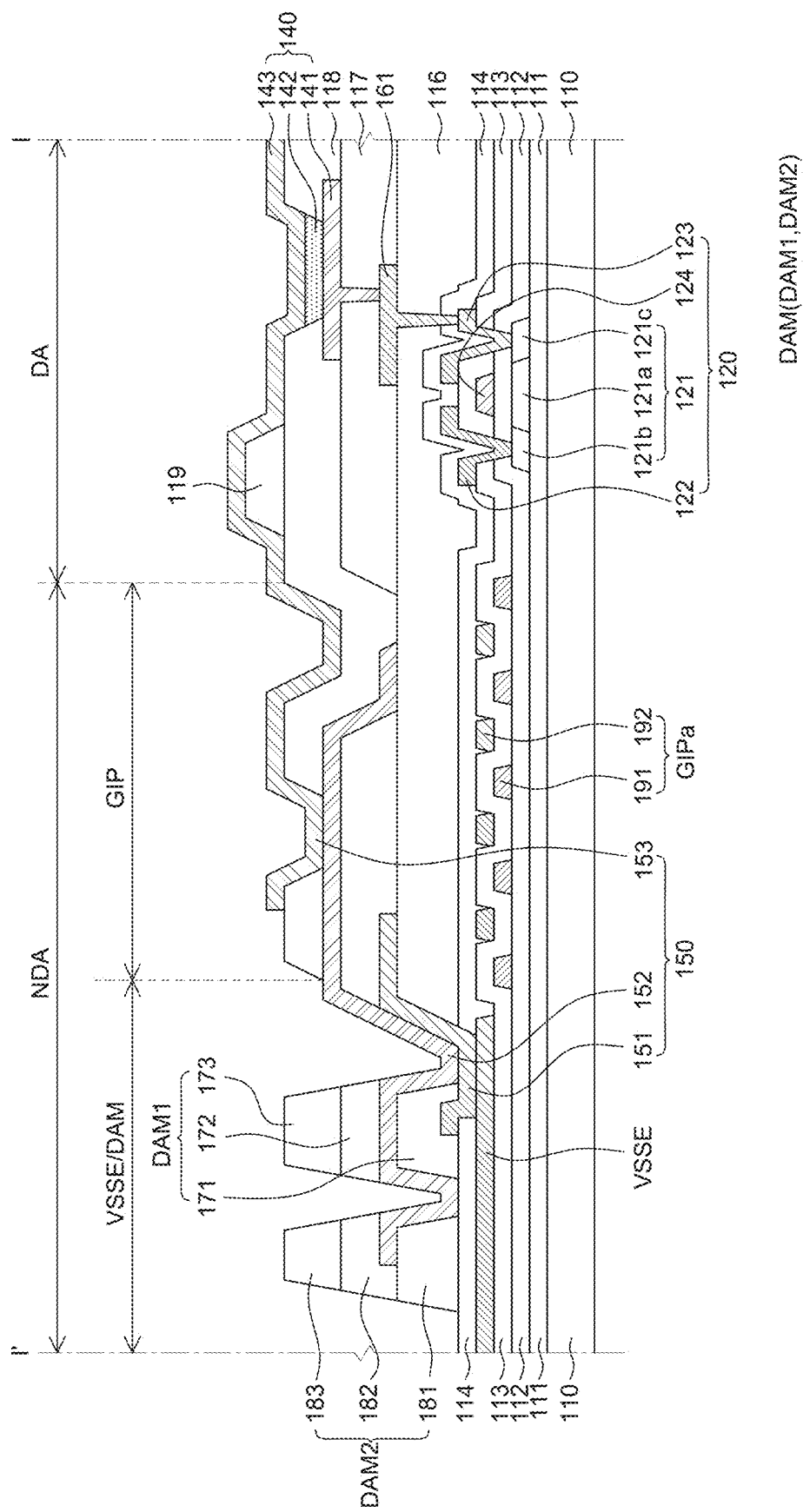
FIG. 2 is a cross-sectional view taken along line I-I' of FIG. 1.

FIG. 2 is a cross-sectional view taken along line I-I' of FIG. 1. With reference to FIG. 2, the display apparatus 100 according to an example embodiment of the present disclosure may include a thin film transistor 120, a light emitting element 140, a substrate 110, a buffer layer 111, a gate insulating layer 112, an interlayer insulating layer 113, a protective layer 114, a first planarizing layer 116, a second planarizing layer 117, an auxiliary electrode 161, a bank 118, a spacer 119, a first gate driver GIPa of a gate driver GIP, a second power supply electrode VSSE, and a dam DAM. The substrate 110 may support various components of the display apparatus 100.

The substrate 110 may be formed of a plastic material having flexibility. When the substrate 110 is formed of a plastic material. For example, the substrate may be formed of polyimide PI. When the substrate 110 is formed of polyimide PI, the manufacturing process of the display apparatus may be performed under a circumstance where a support substrate formed of glass is disposed below the substrate 110, and the support substrate may be released after completing the manufacturing process of the display apparatus. Further, after releasing the support substrate, a back plate which supports the substrate 110 may be disposed below the substrate 110. When the substrate 110 is formed of a polyimide PI layer, moisture components pass through the substrate 110 formed of the polyimide PI layer to permeate the thin film transistor 120 or the emission element 140, so that the performance of the display apparatus 100 may be deteriorated. The display apparatus 100 according to the example embodiment of the present disclosure may configure the substrate 110 by a double base layer to suppress the deterioration of the performance of the display apparatus 100 due to the moisture permeation. Further, a silicon oxide SiOx layer, which may have an excellent moisture permeation effect, may be formed between the two base layers so that the moisture component is blocked from passing through the lower base layer. Therefore, the reliability of the performance of the product may be improved.

Further, charges charged in the base layer which configures the substrate 110 may form a back bias to affect the thin film transistor 120. Therefore, in order to block the charges charged in the base layer, a separate metal layer may be disposed between the substrate 110 and the thin film transistor 120. When the substrate 110 has a bending area BA, in the bending area BA of the substrate 110, the adhesiveness between the silicon oxide SiOx layer disposed between the double base layer and the base layer may be deteriorated due to the moisture. Further, due to the deteriorated adhesiveness between the silicon oxide SiOx layer and the base layer, a stress may be applied to the substrate 110 in the bending area BA, so that the base layer is lifted up. Therefore, the reliability of the product may be deteriorated due to the lift-up phenomenon of the base layer of the substrate 110.

Therefore, in a display apparatus according to an example embodiment of the present disclosure, in order to have a strong structure even in the bending area, while improving the environmental reliability such as moisture permeation, an inorganic insulating layer disposed between two base layers may be formed as a double layer including a silicon oxide SiOx layer and a silicon nitride SiNx layer. However, the present disclosure is not limited thereto, and the inorganic insulating layer may be formed as a triple layer including a silicon oxide SiOx layer and a silicon nitride SiNx layer.

With reference to FIG. 2, a buffer layer 111 having a single layer or a multi-layered structure may be disposed on the substrate 110. The buffer layer 111 disposed on the substrate 110 may be formed by a single layer of silicon nitride SiNx or silicon oxide SiOx or a multi-layer thereof.

The buffer layer 111 may serve to improve adhesiveness between layers formed on the buffer layer 111 and the substrate 110, and to block alkali components leaked from the substrate 110. However, the buffer layer 111 may be omitted based on a type or a material of the substrate 110 and a structure and a type of a thin film transistor.

According to the example embodiment of the present disclosure, the buffer layer 111 may be formed as a multi-layer in which silicon dioxide $SiO_2$ and silicon nitride SiNx are alternately formed.

In the display area DA of the substrate 110, the thin film transistor 120 for driving the light emitting element 140 may be disposed on the buffer layer 111. The thin film transistor 120 includes an active layer 121, a gate electrode 124, a source electrode 122, and a drain electrode 123. Here, depending on the design of the pixel circuit, the source electrode 122 may serve as a drain electrode and the drain electrode 123 may serve as a source electrode. In the display area DA of the substrate 110, the active layer 121 of the thin film transistor 120 may be disposed on the buffer layer 111.

The active layer 121 may include a low temperature poly silicon LTPS. The polysilicon material may have a high mobility (100 $cm^2/Vs$ or higher) so that energy power consumption is low and reliability is excellent. Therefore, the polysilicon material may be applied to a gate driver for driving elements which drive thin film transistors for a display element and/or a multiplexer MUX, and also applied as an active layer of a driving thin film transistor of the display apparatus according to the example embodiment, but is not limited thereto. For example, the polysilicon material may be applied as an active layer of a switching thin film transistor depending on the characteristics of the display apparatus. An amorphous silicon (a-Si) material is deposited on the buffer layer 111, a dehydrogenation process and a crystallization process are performed to form polysilicon, and the polysilicon is patterned to form the active layer 121. The active layer 121 may include a channel region 121a in which a channel is formed at the time of driving the thin film transistor 120, and a source region 121b and a drain region 121c on both sides of the channel region 121a. The source region 121b refers to a portion of the active layer 121 which is connected to the source electrode 122 and the drain region 121c refers to a portion of the active layer 121 which is connected to the drain electrode 123. The source region 121b and the drain region 121c may be configured by ion doping (impurity doping) of the active layer 121. The source region 121b and the drain region 121c may be produced by doping ions into the polysilicon material, and the channel region 121a may refer to a part which is not doped with ion and remains with the polysilicon material.

The active layer 121 may be formed of an oxide semiconductor. The oxide semiconductor material may have a large band gap compared to a silicon material, so that electrons cannot jump over the band gap in an off state. Therefore, the oxide semiconductor material may have a low off-current. Thus, the thin film transistor including an active layer which is formed of an oxide semiconductor may be suitable for a switching thin film transistor which maintains on-time to be short and off-time to be long, but is not limited thereto. Depending on the characteristic of the display apparatus, the oxide semiconductor may be applied as a driving thin film transistor. Further, due to the small off-current, a magnitude of an auxiliary capacitance may be reduced so that the oxide semiconductor may be appropriate for a high resolution display element. For example, the active layer 121 may be formed of metal oxide and, for example, may be formed of various metal oxides such as indium-gallium-zinc-oxide IGZO. Under the assumption that the active layer 121 of the thin film transistor 120 is formed of IGZO, among various metal oxides, it has been described that the active layer is formed based on the IGZO layer, but it is not limited thereto. The active layer may be formed of another metal oxide, such as indium-zinc-oxide IZO, indium-gallium-tin-oxide IGTO, or indium-gallium-oxide IGO. The active layer 121 may be formed by depositing the metal oxide on the buffer layer 111, performing a heat treatment for stabilization, and then patterning the metal oxide.

The gate insulating layer 112 may be disposed on the buffer layer 111 to cover an upper surface of the active layer 121 of the thin film transistor 120. The gate insulating layer 112 may be formed as a single layer of silicon nitride SiNx or silicon oxide SiOx, or a multi-layer thereof. In the gate insulating layer 112, a contact hole through which the source electrode 122 and the drain electrode 123 of the thin film transistor 120 are connected to the source region 121b and the drain region 121c of the active layer 121 of the thin film transistor 120 may be formed. The gate insulating layer 112 may not be disposed in the bending area BA of the non-display area NDA of the substrate 110. With reference to FIG. 2, in the display area DA, the gate insulating layer 112 may be disposed on the active layer 121. In the non-display area NDA, the gate insulating layer 112 may be disposed on the buffer layer 111. As illustrated in FIG. 2, the gate insulating layer 112 may be formed over the entire substrate. However, the present disclosure is not limited thereto. For example, the gate insulating layer 112 may be patterned to have the same width as the gate electrode 124. Alternatively, the gate insulating layer 112 may not be disposed in the bending area BA of the non-display area NDA of the substrate 110.

In the display area DA of the substrate 110, the gate electrode 124 of the thin film transistor 120 and the gate line GL connected to the gate electrode 124 may be disposed on the gate insulating layer 112. The gate electrode 124 and the gate line GL may be formed as a single layer or a multi-layer formed of any one of molybdenum (Mo), copper (Cu), titanium (Ti), aluminum (Al), chrome (Cr), gold (Au), nickel (Ni), and neodymium (Nd), or an alloy thereof, but the present disclosure is not limited thereto. The gate electrode 124 may be formed on the gate insulating layer 112 to overlap the channel region 121a of the active layer 121 of the thin film transistor 120. In the non-display area NDA, the gate driver GIP may be disposed on the gate insulating layer 112. With reference to FIG. 2, the first gate driver GIPa of the gate driver GIP may be disposed on the gate insulating layer 112. For example, in the non-display area NDA, a first gate driving element 191 of the first gate driver GIPa may be disposed on the gate insulating layer 112. The first gate driving element 191 may be disposed on the same layer as the gate electrode 124 of the thin film transistor 120 and may be formed of the same material.

With reference to FIG. 2, the interlayer insulating layer 113 may be disposed on the gate insulating layer 112 to cover the gate electrode 124 and the gate line GL of the display area DA and the first gate driving element 191 of the first gate driver GIPa of the non-display area NDA. The interlayer insulating layer 113 may be formed as a single layer of silicon nitride SiNx or silicon oxide SiOx, or a multi-layer thereof. A contact hole through which the source region 121b and the drain region 121c of the active layer 121 of the thin film transistor 120 are exposed may be formed in the interlayer insulating layer 113. Further, as illustrated in FIG. 2, the interlayer insulating layer 113 may be formed over the entire substrate, but is not limited thereto. For example, the interlayer insulating layer 113 may not be disposed in the bending area BA of the substrate 110. Alternatively, the interlayer insulating layer 113 may be formed only in the display area.

In the display area DA of the substrate 110, the source electrode 122 and the drain electrode 123 of the thin film transistor 120 may be disposed on the interlayer insulating layer 113. The source electrode 122 and the drain electrode 123 of the thin film transistor 120 may be connected to the active layer 121 of the thin film transistor 120 through the contact holes formed in the gate insulating layer 112 and the interlayer insulating layer 113. Therefore, the source electrode 122 of the thin film transistor 120 may be connected to the source region 121b of the active layer 121 through the contact holes formed in the gate insulating layer 112 and the interlayer insulating layer 113. Therefore, the drain electrode 123 of the thin film transistor 120 may be connected to the drain region 121c of the active layer 121 through the contact holes formed in the gate insulating layer 112 and the interlayer insulating layer 113. The source electrode 122 and the drain electrode 123 may be any one of molybdenum (Mo), copper (Cu), titanium (Ti), aluminum (Al), chrome (Cr), gold (Au), nickel (Ni), and neodymium (Nd), or an alloy thereof and formed as a single layer or a multi-layer. For example, the source electrode 122 and the drain electrode 123 may be formed by a three-layered conductive metal material structure of titanium (Ti)/aluminum (Al)/titanium (Ti). The materials of the source electrode 122 and the drain electrode 123 are not limited to the above-described matter. In FIG. 2, even though only a driving thin film transistor is illustrated among various thin film transistors which may be included in the display apparatus 100 for the convenience of description, another thin film transistor such as a switching thin film transistor may also be included in the display apparatus 100. Further, in the present disclosure, even though it is described that the thin film transistor 120 has a coplanar structure, the thin film transistor may be implemented to have another structure, such as a staggered structure.

With reference to FIG. 2, in the display area DA of the substrate 110, a second gate driving element 192 of the first gate driver GIPa may be disposed on the interlayer insulating layer 113. The second gate driving element 192 may be disposed on the same layer as the source electrode 122 and the drain electrode 123 of the thin film transistor 120 and may be formed of the same material. As illustrated in FIG. 2, the gate driver GIP may be configured by various components such as the first gate driving element 191 and the second gate driving element 192. Further, in the non-display area NDA, the second power supply electrode VSSE may be disposed on the interlayer insulating layer 113. The second power supply electrode VSSE may be disposed on the same layer as the source electrode 122 and the drain electrode 123 of the thin film transistor 120, and may be formed of the same material. However, it is not limited thereto, and the second power supply electrode may be formed of the same material as the gate electrode 122 or the auxiliary electrode 161.

As will be described below, the second power supply electrode VSSE may be electrically connected to the second electrode 143 to supply a power to the second electrode 143. With reference to FIG. 2, in the display area DA and the non-display area NDA, the protective layer 114 may be disposed on the thin film transistor 120, the second power supply electrode VSSE, and the first gate driver GIPa. The protective layer 114 may be disposed to cover the thin film transistor 120, the second power supply electrode VSSE, and the first gate driver GIPa. The protective layer 114 may be formed as a single layer of silicon nitride SiNx or silicon oxide SiOx, or a multi-layer thereof. In the display area DA, a contact hole through which the drain electrode 123 of the thin film transistor 120 is exposed may be formed in the protective layer 114. The protective layer 114 may not be disposed in the bending area BA of the substrate 110. Further, in the non-display area NDA, a contact hole through which the second power supply electrode VSSE is exposed may be formed in the protective layer 114.

In the display area DA and the non-display area NDA, the first planarizing layer 116 may be disposed on the protective layer 114. In the display area DA and the non-display area NDA, the first planarizing layer 116 may be disposed on the protective layer 114 to overlap the thin film transistor 120 of the display area DA and the gate driver GIP of the non-display area NDA. For example, as illustrated in FIG. 2, the first planarizing layer 116 may be disposed in a region of the display area DA and the non-display area NDA where the first gate driver GIPa is located. Further, in an area where the second power supply electrode VSSE is located, the first planarizing layer 116 is removed so that an opening which exposes the protective layer 114 may be formed.

With reference to FIGS. 1 and 2, in the non-display area NDA, the first planarizing layer 116 may be disposed to cover the thin film transistor 120 and the gate driver GIP. In the display area DA, a contact hole through which the drain electrode 123 is exposed may be formed in the first planarizing layer 116. Further, in the non-display area NDA, the first planarizing layer 116 includes an opening exposing an upper surface of the protective layer 114 overlapped with second power supply electrode VSSE. In the opening, a second connection electrode 152 is in direct contact with the protective layer 114. The first planarizing layer 116 may be an organic material layer which protects the thin film transistor 120 and the first gate driver GIPa, and smooths over a step by a plurality of layers formed on the substrate 110 to planarize an upper portion of the substrate 110. For example, the first planarizing layer 116 may be formed of an organic material such as acryl resin, epoxy resin, phenolic resin, polyamide resin, or polyimide resin, but is not limited thereto. In the display area DA of the substrate 110, the auxiliary electrode 161 may be formed on the first planarizing layer 116. The auxiliary electrode 161 may be connected to the drain electrode 123 of the thin film transistor 120 through the contact holes of the first planarizing layer 116 and the protective layer 114, which expose the drain electrode 123. The auxiliary electrode 161 may serve to electrically connect the thin film transistor 120 and the light emitting element 140. For example, the auxiliary electrode 161 may serve to electrically connect the drain electrode 123 of the thin film transistor 120 and the first electrode 141 of the light emitting element 140. The auxiliary electrode 161 may be formed of a single layer or a multi-layer formed of any one of molybdenum (Mo), copper (Cu), titanium (Ti), aluminum (Al), chrome (Cr), gold (Au), nickel (Ni), and neodymium (Nd), or an alloy thereof, but is not limited thereto. The auxiliary electrode 161 may be formed of the same material as the source electrode 122 and the drain electrode 123 of the thin film transistor 120, but is not limited thereto.

In the non-display area NDA of the substrate 110, a first connection electrode 151 of the connection electrode 150 may be disposed on the first planarizing layer 116. Further, the first connection electrode 151 may be connected to the second power supply electrode VSSE through the opening of the first planarizing layer 116 which exposes the second power supply electrode VSSE and the contact hole of the protective layer 114. The connection electrode 150 serves to electrically connect the second power supply electrode VSSE and the light emitting element 140. For example, the first connection electrode 151 of the connection electrode 150 may serve to electrically connect the second power supply electrode VSSE and the second electrode 143 of the light emitting element 140. The first connection electrode 151 may be formed of a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof, but is not limited thereto. The first connection electrode 151 may be disposed on the same layer as the auxiliary electrode 161 or the source electrode 122 and the drain electrode 123 of the thin film transistor 120 and may be formed of the same material.

With reference to FIG. 2, the first planarizing layer 116 may be disposed in the display area DA and the non-display area NDA, and may not be disposed in an area of the non-display area NDA where at least one of the second power supply electrode VSSE and the dam DAM is located. For example, the first planarizing layer 116 may not be disposed in an area where the second power supply electrode VSSE is located. And, for example, the first planarizing layer 116 may not be disposed in an area where the dam DAM is disposed and the second power supply electrode VSSE is exposed through the contact hole of the protective layer 114.

In the display area DA of the substrate 110, the second planarizing layer 117 may be disposed on the auxiliary electrode 161 and the first planarizing layer 116. For example, the second planarizing layer 117 may be disposed to cover the auxiliary electrode 161 on the first planarizing layer 116. Further, as illustrated in FIG. 2, a contact hole may be formed in the second planarizing layer 117 to expose the auxiliary electrode 161. The second planarizing layer 117 may be an organic material layer which further makes the step of a lower structure due to the auxiliary electrode 161 on the first planarizing layer 116 gentle, and additionally protects the lower structure. For example, the second planarizing layer 117 may be formed of an organic material such as acryl resin, epoxy resin, phenolic resin, polyamide resin, or polyimide resin, but is not limited thereto. The second planarizing layer 117 may be formed of the same material as the first planarizing layer 116.

In the non-display area NDA of the substrate 110, the second planarizing layer 117 may be disposed on the first planarizing layer 116. The second planarizing layer 117 may be disposed to cover one side of the first connection electrode 151. Further, the second planarizing layer 117 may not be disposed in an area where the second power supply electrode VSSE is located. Additionally, the second planarizing layer 117 may not be disposed in an area adjacent to the display area DA among the areas where the first gate driver GIPa of the gate driver GIP is located. For example, the second planarizing layer 117 may not be disposed in an area which is adjacent to the display area DA and overlaps the first gate driver GIPa.

With reference to FIG. 2, in the non-display area NDA, the second planarizing layer 117 may include an opening which exposes an upper surface of the first planarizing layer 116 of the area overlapping the first gate driver GIPa of the gate driver GIP. In the opening, the second connection electrode 152 is in direct contact with an upper surface of the first planarizing layer 116.

In the display apparatus 100 according to the example embodiment of the present disclosure, as a planarizing layer for planarizing the upper portion of the thin film transistor 120 in the display area DA, the first planarizing layer 116 and the second planarizing layer 117 are used in the display area DA. Therefore, an additional space for disposing various wiring lines used for the display area DA of the display apparatus 100 may be provided.

For example, as compared with an example that uses one planarizing layer in the display area DA, a space between the first planarizing layer 116 and the second planarizing layer 117, that is, an additional space for disposing wiring lines on an upper surface of the first planarizing layer 116, may be provided. Therefore, in the display apparatus 100 according to the example embodiment of the present disclosure, a degree of freedom of design for wiring line arrangement may be increased. Therefore, a display apparatus 100 having a higher resolution may be provided, and a luminance irregularity problem which may be caused by the high resistance of a wiring line disposed in the display area DA of the display apparatus 100 may be resolved.

Further, in the display apparatus 100 according to the example embodiment of the present disclosure, two planarizing layers 116 and 117 are used in the display area DA, and one planarizing layer is used in a partial area of the non-display area NDA, so that a volume of the planarizing layer from which gas components are outgassed, in the non-display area NDA, may be reduced and/or minimized. Therefore, as compared with the example which uses two planarizing layers in the non-display area NDA, the outgassed gas is reduced so that the pixel shrinkage defect is reduced and the reliability of the display apparatus 100 may be improved. For example, a partial area of the second planarizing layer 117 disposed in an area corresponding to the gate driver GIP is removed so that only the first planarizing layer 116 overlaps the gate driver GIP. Further, in the non-display area NDA, the second planarizing layer 117 disposed in an area corresponding to the second power supply electrode VSSE is removed to form an opening.

In the display area DA, two planarizing layers 113 and 114 are disposed between the thin film transistor 120 and the light emitting element 140 so that it may be difficult to electrically connect the first electrode 141 and the thin film transistor 120 through a single contact hole forming process. Therefore, in the display apparatus 100 according to the example embodiment of the present disclosure, the auxiliary electrode 161 which is electrically connected to the thin film transistor 120 is disposed on the first planarizing layer 116 in the display area DA. The first electrode 141 disposed on the second planarizing layer 117 may be connected to the auxiliary electrode 161 through the contact hole of the second planarizing layer 117. In the display area DA of the substrate 110, the light emitting element 140 may be disposed on the second planarizing layer 117. The light emitting element 140 may include a first electrode 141, an emission structure 142, and a second electrode 143. Further, the light emitting element 140 may not be disposed in the bending area BA of the substrate 110.

The first electrode 141 of the light emitting element 140 may be disposed on the second planarizing layer 117. The first electrode 141 may be electrically connected to the auxiliary electrode 161 through the contact hole formed in the second planarizing layer 117. Therefore, the first electrode 141 is electrically connected to the auxiliary electrode 161 through the contact hole formed in the second planarizing layer 117 to be electrically connected to the thin film transistor 120.

The first electrode 141 may be formed to have a multi-layered structure including a transparent conductive layer and an opaque conductive layer having high reflection efficiency. The transparent conductive layer may be formed of a material having a high work function, such as indium-tin-oxide ITO or indium-zinc-oxide IZO. The opaque conductive layer may be formed to have a single layer or a multi-layered structure including Al, Ag, Cu, Pb, Mo, Ti, or an alloy thereof. For example, the first electrode 141 may be formed to have a structure in which a transparent conductive layer, an opaque conductive layer, and a transparent conductive layer are sequentially laminated. However, the first electrode 141 is not limited thereto, and may also be formed to have a structure in which the transparent conductive layer and the opaque conductive layer are sequentially laminated.

Because the display apparatus 100 according to the example embodiment of the present disclosure is a top emission display apparatus, the first electrode 141 may be an anode electrode. When the display apparatus 100 is a bottom emission type, the first electrode 141 disposed on the second planarizing layer 117 may be a cathode electrode.

A bank 118 may be disposed on the first electrode 141 and the second planarizing layer 117. In the display area DA, an opening which exposes the first electrode 141 may be formed in the bank 118. Because the bank 118 defines an emission area of the display apparatus 100, the bank 180 may also be referred to as a pixel definition film. The bank 118 may be disposed to cover both ends of the first electrode 141. A spacer 119 may be further disposed on the bank 118. Further, in the non-display area NDA, a contact hole through which the second connection electrode 152 is exposed may be formed in the bank 118.

The bank 118 and the spacer 119 may be formed of the same material. Further, the bank 118 and the spacer 119 may be formed of an organic material. For example, the bank 118 and the spacer 119 may be formed of polyimide, acryl, or benzocyclobutene BCB resin, but the present disclosure is not limited thereto.

Further, an emission structure 142 including a light emitting layer may be further disposed on the first electrode 141. Even though in FIG. 2, it is illustrated that the emission structure 142 is patterned for every pixel PX, the present disclosure is not limited thereto, and the emission structure 142 may be a common layer which is commonly formed for the plurality of pixels P. The emission structure 142 may be formed such that a hole layer, a light emitting layer, and an electron layer are laminated on the first electrode 141 in this order or a reverse order. In addition, the emission structure 142 may include first and second emission structures which are opposite to each other, with a charge generating layer therebetween. In this case, any one of the first and second emission structures generates blue light and the other one of the first and second emission structures generates yellow-green light, so that white light may be generated by the first and the second emission structures. The white light generated in the emission structure 142 is incident onto a color filter disposed above the emission structure 142 to implement color images. In addition, individual emission structures 142 generate color light corresponding to individual sub pixels without having separate color filters to implement color images. For example, the emission structure 142 of a red R sub pixel generates red light, the emission structure 142 of a green G sub pixel generates green light, and the emission structure 142 of a blue B sub pixel generates blue light.

The second electrode 143 may be further disposed on the emission structure 142. The second electrode 143 may be disposed on the emission structure 142 to be opposite to the first electrode 141 with the emission structure 142 therebetween. In the display apparatus 100 according to the example embodiment of the present disclosure, the second electrode 143 may be a cathode electrode.

In the display area DA of the substrate 110, an encapsulating unit may be disposed on the light emitting element. For example, the encapsulating unit 220 may be further disposed on the second electrode 143 to suppress moisture permeation. Further, the encapsulating unit may not be disposed in the bending area BA of the substrate 110.

The encapsulating unit may include a first inorganic encapsulating layer, a second organic encapsulating layer, and a third inorganic encapsulating layer. The first inorganic encapsulating layer of the encapsulating unit may be disposed on the second electrode. The second organic encapsulating layer may be disposed on the first inorganic encapsulating layer. Further, the third inorganic encapsulating layer may be disposed on the second organic encapsulating layer. The first inorganic encapsulating layer and the third inorganic encapsulating layer of the encapsulating unit may be formed of an inorganic material such as silicon nitride SiNx or silicon oxide SiOx. For example, the second organic encapsulating layer of the encapsulating unit may be formed of an organic material such as acryl resin, epoxy resin, phenolic resin, polyamide resin, or polyimide resin.

In the non-display area NDA, the dam DAM may be disposed on the protective layer 114. For example, a first dam DAM1 and a second dam DAM2 may be disposed on the protective layer 114. The first dam DAM1 and the second dam DAM2 may overlap the first power supply electrode VSSE. For example, lower surfaces of the first dam DAM1 and the second dam DAM2 may be disposed to overlap the upper surface of the first power supply electrode VSSE. The first dam DAM1 may be disposed between the second dam DAM2 and the display area DA. Also, the first dam DAM1 may be disposed between the second dam DAM2 and the first gate driver GIPa. Further, the first dam DAM1 is spaced apart from an end of the first planarizing layer 116 to expose the first connection electrode 151.

With reference to FIG. 2, a 1-a dam layer 171 of the first dam DAM1 and a 2-a dam layer 181 of the second dam DAM2 may be disposed on the protective layer 114. The 1-a dam layer 171 and the 2-a dam layer 181 may be formed of the same material as the second planarizing layer 117 and may be formed by the same process. The 1-a dam layer 171 of the first dam DAM1 is spaced apart from the first planarizing layer 116 to expose the first connection electrode 151. Further, the 1-a dam layer 171 of the first dam DAM1 may be disposed to cover one end of the first connection electrode 151 of the connection electrode 150. One end of the first connection electrode 151 is disposed between a lower surface of the 1-a dam 171 of the first dam DAM1 and the upper surface of the protective layer 114, and the other end of the first connection electrode 151 may be disposed between the upper surface of the first planarizing layer 116 and the lower surface of the second planarizing layer 117.

With reference to FIG. 2, in the non-display area NDA, the second connection electrode 152 of the connection electrode 150 may be disposed on the second planarizing layer 117, the 1-a dam layer 171, and the 2-a dam layer 181. The second connection electrode 152 may be formed by the same process as the first electrode 141 and may be formed of the same material. The second connection electrode 152 is disposed in a space formed by the first dam DAM1 and the first planarizing layer 116, which are spaced apart from each other to be connected to the first connection electrode 151. The second connection electrode 152 may also be disposed in a space formed by the first dam DAM1 and the second dam DAM2, which are spaced apart from each other. Further, one end of the second connection electrode 152 may be disposed between the lower surface of a 2-b dam layer 182 and the upper surface of a 2-a dam layer 181.

The 1-b dam layer 172 of the first dam DAM1 may be disposed on the 1-a dam layer 171. Further, the 2-b dam layer 182 of the second dam DAM2 may be disposed on the 2-a dam layer 181. With reference to FIG. 2, the second connection electrode 152 may be disposed between the 1-b dam layer 172 and the 1-a dam layer 171. The 1-b dam layer 172 and the 2-b dam layer 182 may be formed by the same process as the bank 118 and may be formed of the same material.

With reference to FIG. 2, in the non-display area NDA, one end of the second connection electrode 152 is disposed in a portion where the first dam DAM1 and the first planarizing layer 116 are separated from each other. In the portion, the second connection electrode 152 is in direct contact with the upper surface of the first connection electrode 151. Further, the other end of the second connection electrode 152 is disposed in the opening of the second planarizing layer 117 which exposes the upper surface of the first planarizing layer 116 to be in direct contact with the upper surface of the first planarizing layer 116.

A 1-c dam layer 173 of the first dam DAM1 may be disposed on the 1-b dam layer 172. Further, the 2-c dam layer 183 of the second dam DAM2 may be disposed on the 2-b dam layer 182. Further, the 1-c dam layer 173 and the 2-c dam layer 183 may be formed by the same process as the spacer 119 and may be formed of the same material.

The example embodiment of the present disclosure illustrates that that the display apparatus 100 has two dams DAM formed by a triple layer. However, the present disclosure is not limited thereto. For example, the dam DAM may be formed by a double layer. When the dam DAM is formed by the double layer, a lower layer of the dam DAM may be formed of the same material as the second planarizing layer 117, and an upper layer may be formed of the same material as the bank 118.

In the non-display area NDA, a third connection electrode 153 may be disposed on the bank 118. The third connection electrode 153 may be formed by the same process as the second electrode 143 and may be formed of the same material. Further, the third connection electrode 153 may be connected to the second connection electrode 152, which is exposed through the contact hole of the bank 118. The third connection electrode 153 is connected to the second electrode 143 to supply a second power Vss supplied from the second power supply electrode VSSE. In this way, the connection electrode 150 serves to electrically connect the second power supply electrode VSSE and the second electrode 143 to each other. Further, the second electrode 143 disposed in the display area DA and the third connection electrode 153 disposed in the non-display area NDA may be connected to each other to be integrally formed.

Figure 3:
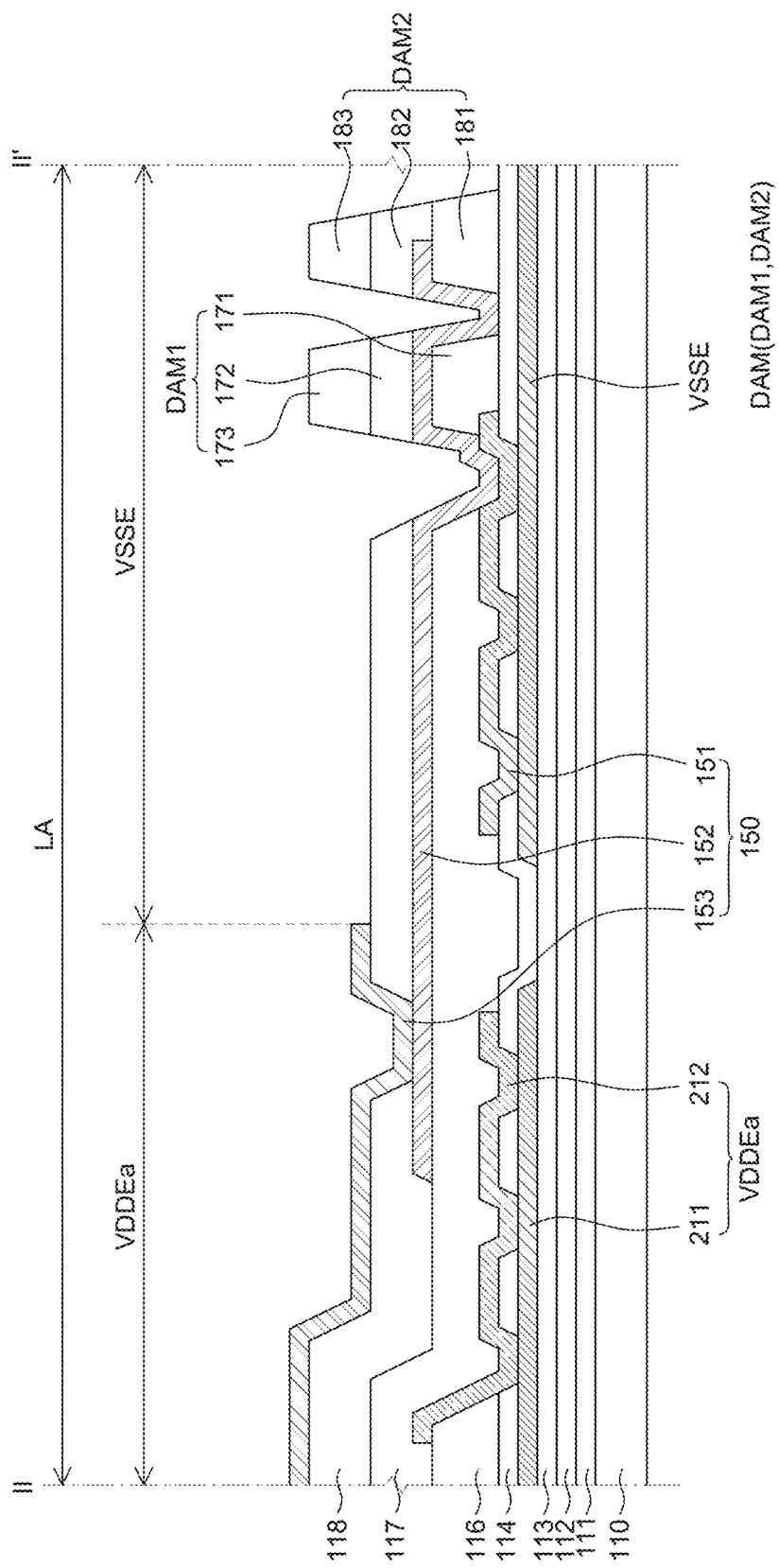
FIG. 3 is a cross-sectional view taken along line II-IF of FIG. 1.

FIG. 3 is a cross-sectional view taken along the line II-IF of FIG. 1, which illustrates one end of a 1-a power supply electrode VDDEa and one end of a second power supply electrode VSSE. A portion which is substantially the same as the component illustrated in FIG. 2 will be briefly described or the description thereof will be omitted.

With reference to FIGS. 1 and 3, in the link area LA of the non-display area NDA, one end of the 1-a power supply electrode VDDEa may be disposed between one end of the second power supply electrode VSSE and the display area DA. In the link area LA, one end of the second power supply electrode VSSE and one end of the 1a power supply electrode VDDEa may be disposed to be spaced apart from each other. A protective layer 114 is disposed in a space formed by one end of the second power supply electrode VSSE and one end of the 1a power supply electrode VDDEa, which are spaced apart from each other to be insulated. Further, on the protective layer 114, a second planarizing layer 117 is disposed to be in direct contact with an upper surface of the protective layer 114.

In the link area LA, the dam DAM overlaps one end of the second power supply electrode VSSE and overlaps a center portion of 1a power supply electrode VDDEa. For example, with reference to FIG. 1, the 1a power supply electrode VDDEa of the first power supply electrode VDDE disposed in the link area LA may have a different line width. A first area of the 1a power supply electrode VDDEa may have a first line width and a second area may have a second line width which is larger than the first line width. The first area may include both ends of the 1a power supply electrode VDDEa and the second area may include a center portion of the 1a power supply electrode VDDEa. The first area of the 1a power supply electrode VDDEa may be disposed between the second power supply electrode VSSE and the display area DA. Further, the first dam DAM1 and the second dam DAM2 may be disposed to overlap the second area of the 1a power supply electrode VDDEa. The first dam DAM1 and the second dam DAM2 may be disposed not to overlap the first area of the 1-a power supply electrode VDDEa. As illustrated in FIG. 1, the first dam DAM1 and the second dam DAM2 may be disposed to overlap only the second area of the 1a power supply electrode VDDEa, but may not overlap the first area.

With reference to FIG. 3, in the link area LA of the non-display area NDA, the 1a power supply electrode VDDEa of the first power supply electrode VDDE and the second power supply electrode VSSE may be disposed on the interlayer insulating layer 113. The 1a power supply electrode VDDEa may be formed by a 1a power lower electrode layer 211 and a 1a power upper electrode layer 212. For example, with reference to FIG. 3, the 1a power lower electrode layer 211 of the 1a power supply electrode VDDEa may be disposed on the interlayer insulating layer 113. The protective layer 114 is disposed on the 1a power lower electrode layer 211, and the protective layer 114 may include a contact hole which exposes the 1a power lower electrode layer 211. The 1a power upper electrode layer 212 may be disposed on the protective layer 114 and the 1a power lower electrode layer 211. The 1a power upper electrode layer 212 may be connected to the 1a power lower electrode layer 211 through the contact hole of the protective layer 114 which exposes the 1a power lower electrode layer 211. The 1a power lower electrode layer 211 may be disposed on the same layer as the second power supply electrode VSSE and may be formed of the same material. The 1a power lower electrode layer 211 may be formed of the same material as the source electrode 122 and the drain electrode 123 of the thin film transistor 120.

The protective layer 114 may be disposed on the 1a power lower electrode layer 211 of the 1a power supply electrode VDDEa and the second power supply electrode VSSE. The protective layer 114 may be disposed to cover the 1a power lower electrode layer 211 of the 1a power supply electrode VDDEa and the second power supply electrode VSSE. The protective layer 114 may include a contact hole which exposes the 1a power lower electrode layer 211 of the 1a power supply electrode VDDEa. Further, the protective layer 114 may include a contact hole which exposes the second power supply electrode VSSE. The first planarizing layer 116 may be disposed on the protective layer 114. The first planarizing layer 116 may not be disposed in an area overlapping the second power supply electrode VSSE. The first planarizing layer 116 may not be disposed in an area where the second power supply electrode VSSE is exposed through the contact hole of the protective layer 114 and an area where the DAM is disposed. Further, the first planarizing layer 116 may not be disposed also in the area where the 1a power lower electrode layer 211 of the 1a power supply electrode VDDEa is exposed through the contact hole of the protective layer 114. With reference to FIG. 3, the area where the second power supply electrode VSSE is exposed through the contact hole of the protective layer 114, the area where the dam DAM is disposed, and the area where the 1a power lower electrode layer 211 of the 1a power supply electrode VDDEa is exposed through the contact hole of the protective layer 114 may be formed as a single planarizing layer, rather than a double planarizing layer. For example, only the second planarizing layer 117 is disposed in the above-mentioned areas.

With reference to FIG. 3, in the link area LA, the first planarizing layer 116 may be disposed to cover only one side of the 1a power lower electrode layer 211. Furthermore, with reference to FIG. 3, in the link area LA, the area where the first connection electrode 151 and the second connection electrode 152 are disposed, which are electrically connected to the second power supply electrode VSSE, may be formed as a single planarizing layer. For example, in the link area LA, only the second planarizing layer 117 is disposed in the area where the first connection electrode 151 and the second connection electrode 152 are disposed and overlapped.

The 1a power upper electrode layer 212 may be disposed on the 1a power lower electrode layer 211 of the 1a power supply electrode VDDEa which is exposed through the contact hole of the protective layer 114. The 1a power upper electrode layer 212 may be formed by the same process as the auxiliary electrode 161 and may be formed of the same material. The 1a power supply electrode VDDEa may be formed by a double layer of the 1a power lower electrode layer 211 and the 1a power upper electrode layer 212 so that the resistance of the 1a power supply electrode VDDEa may be lowered.

One side of the 1a power upper electrode layer 212 may be disposed on an upper surface of the first planarizing layer 116. The other side of the 1a power upper electrode layer 212 may be disposed on an upper surface of the protective layer 114. For example, the 1a power upper electrode layer 212 may be disposed to cover one side of the first planarizing layer 116. With reference to FIG. 3, the 1a power upper electrode layer 212 may be disposed on an upper surface of one side of the first planarizing layer 116 which is disposed to cover one side of the 1a power lower electrode layer 211.

The second planarizing layer 117 disposed on the first planarizing layer 116 may not be disposed in the area where the second power supply electrode VSSE is exposed through the contact hole of the protective layer 114 and the area where the DAM is disposed.

Figure 4:
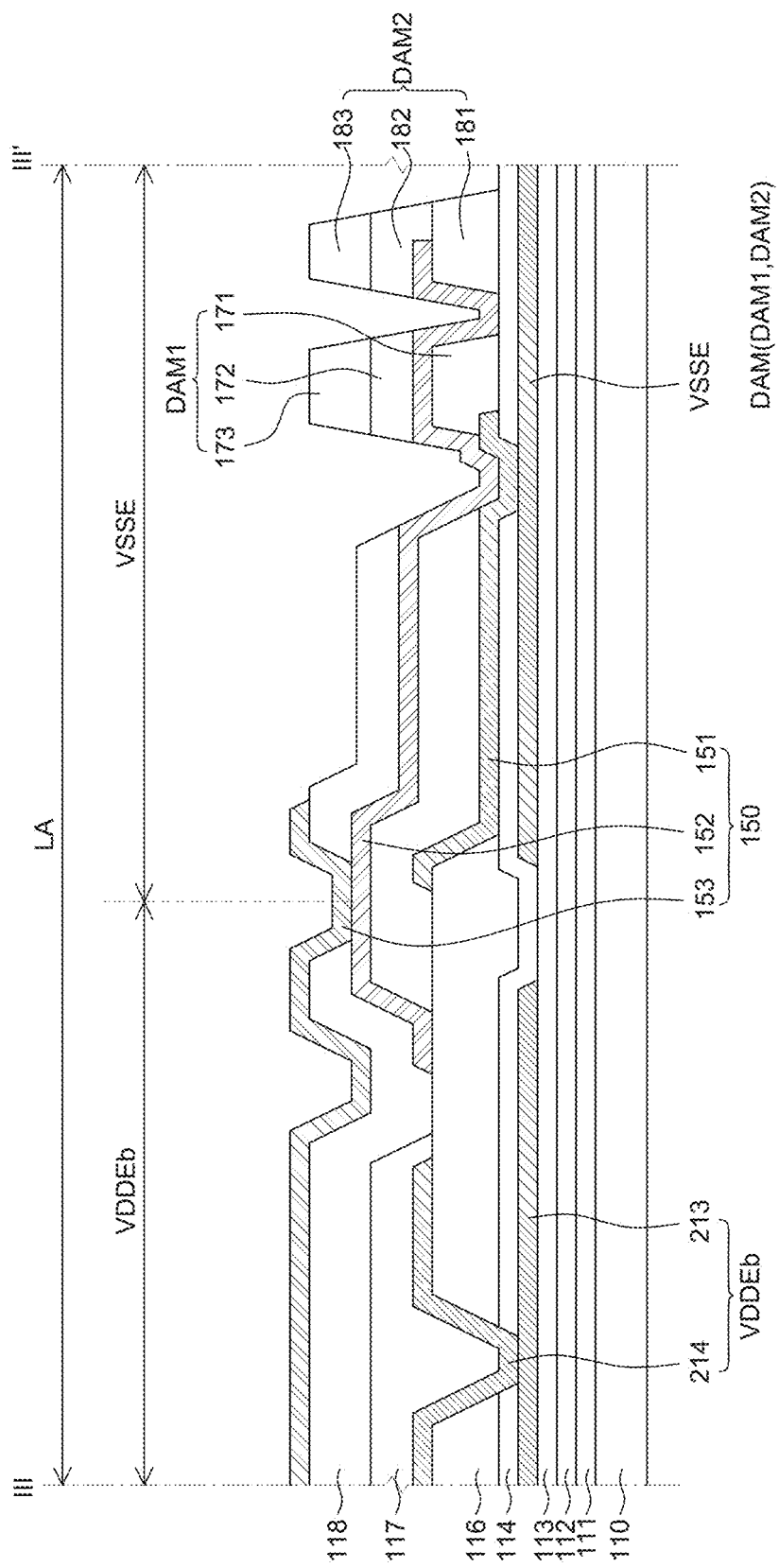
FIG. 4 is a cross-sectional view taken along line of FIG. 1.

FIG. 4 is a cross-sectional view taken along line of FIG. 1, which illustrates a cross-sectional view illustrating a 1-b power supply electrode VDDEb and a second power supply electrode VSSE. A portion which is substantially the same as the component illustrated in FIGS. 2 and 3 will be briefly described or the description thereof will be omitted.

With reference to FIGS. 1 and 4, in the non-display area NDA, the 1b power supply electrode VDDEb may be disposed between the second power supply electrode VSSE and the display area DA. The dam DAM may be disposed to overlap the second power supply electrode VSSE. The 1b power supply electrode VDDEb may be disposed to face the 1a power supply electrode VDDEa with the display area DA therebetween. As illustrated in FIG. 1, the first dam DAM1 and the second dam DAM2 may be disposed to overlap the second power supply electrode VSSE.

With reference to FIG. 4, in the non-display area NDA, the 1b power supply electrode VDDEb of the first power supply electrode VDDE and the second power supply electrode VSSE may be disposed on the interlayer insulating layer 113. The 1b power supply electrode VDDEb may be formed by a 1b power lower electrode layer 213 and a 1b power upper electrode layer 214. The 1b power lower electrode layer 213 of the 1b power supply electrode VDDEb is disposed on the interlayer insulating layer 113, and the protective layer 114 may be disposed on the 1b power lower electrode layer 213. Further, the protective layer 114 may include a contact hole which exposes the 1b power lower electrode layer 213. The 1b power upper electrode layer 214 may be disposed on the 1b power lower electrode layer 213. The 1b power lower electrode layer 213 may be disposed on the same layer as the second power supply electrode VSSE and may be formed of the same material. The 1b power lower electrode layer 213 may be formed of the same material as the source electrode 122 and the drain electrode 123 of the thin film transistor 120.

Further, the protective layer 114 may be disposed on the 1b power lower electrode layer 213 of the 1b power supply electrode VDDEb and the second power supply electrode VSSE. The protective layer 114 may include a contact hole which exposes the 1b power lower electrode layer 213 of the 1b power supply electrode VDDEb. Further, the protective layer 114 may include a contact hole which exposes the second power supply electrode VSSE. The first planarizing layer 116 may be disposed on the protective layer 114. The first planarizing layer 116 may not be disposed in an area overlapping the second power supply electrode VSSE. For example, the first planarizing layer 116 may not be disposed in an area where the second power supply electrode VSSE is exposed through the contact hole of the protective layer 114 and an area where the DAM is disposed. Further, the first planarizing layer 116 may not be disposed also in the area where the 1b power lower electrode layer 213 of the 1b power supply electrode VDDEb is exposed through the contact hole of the protective layer 114.

With reference to FIG. 4, in the non-display area NDA, the area where the first connection electrode 151 which is electrically connected to the second power supply electrode VSSE is disposed may be formed as a single planarizing layer. In the non-display area NDA, only the second planarizing layer 117 may be disposed in the area where the first connection electrode 151 is disposed.

The 1b power upper electrode layer 214 may be disposed on the 1b power lower electrode layer 213 of the 1b power supply electrode VDDEb which is exposed through the contact hole of the protective layer 114. The 1b power upper electrode layer 214 may be formed by the same process as the auxiliary electrode 161 and may be formed of the same material. The 1b power supply electrode VDDEb may be formed by a double layer of a 1b power lower electrode layer 213 and a 1b power upper electrode layer 214 so that the resistance of the 1b power supply electrode VDDEb may be reduced.

Both ends of the 1b power upper electrode layer 214 may be disposed on an upper surface of the first planarizing layer 116.

The second planarizing layer 117 disposed on the first planarizing layer 116 may not be disposed in the areas where the second power supply electrode VSSE is exposed through the contact hole of the protective layer 114 and the dam DAM is disposed. The second planarizing layer 117 corresponding to the 1b power supply electrode VDDEb is patterned to form an opening which exposes the upper surface of the first planarizing layer 116. The second connection electrode 152 is disposed in a portion where the first dam DAM1 and the second planarizing layer 117 are spaced apart from each other. In the portion, the second connection electrode 152 may be in contact with the first connection electrode 151, and may extend to the opening of the second planarizing layer 117 which exposes the first planarizing layer 116. One end of the second connection electrode 152 may be in direct contact with the upper surface of the first planarizing layer 116, and the other end of the second connection electrode 152 may be in direct contact with the upper surface of the first connection electrode 151.

According to an aspect of the present disclosure, an electroluminescence display apparatus includes a substrate including a display area and a non-display area, wherein the non-display area surrounds the display area and includes a pad area, a bending area, and a link area; a plurality of thin film transistors on the substrate in the display area; a first power supply electrode on the substrate in the link area of the non-display area, wherein the link area is between the bending area and the display area; a second power supply electrode on the substrate in the non-display area; a gate driver in the non-display area and between the second power supply electrode and the display area; a protective layer covering the plurality of thin film transistors, the gate driver, the first power supply electrode, and the second power supply electrode; a first planarizing layer covering the plurality of thin film transistors and the gate driver; a second planarizing layer on the first planarizing layer in the non-display area, the second planarizing layer including a first opening that exposes a surface of the first planarizing layer in an area overlapping the gate driver; and a plurality of light emitting elements on the second planarizing layer in the display area.

According to the example embodiment of the present disclosure, the first power supply electrode may include a first area having a first line width and a second area having a second line width that is larger than the first line width.

According to the example embodiment of the present disclosure, in the link area of the non-display area, the first area of the first power supply electrode may be between the second power supply electrode and the display area.

According to the example embodiment of the present disclosure, in the non-display area, the protective layer may include a contact hole that exposes the second power supply electrode.

According to the example embodiment of the present disclosure, the electroluminescence display apparatus may further include a connection electrode connected to the second power supply electrode exposed through the contact hole of the protective layer in the non-display area.

According to the example embodiment of the present disclosure, in the non-display area, the first planarizing layer may include a second opening that exposes a surface of the protective layer in an area overlapping the second power supply electrode.

According to the example embodiment of the present disclosure, the electroluminescence display apparatus may further include a first dam and a second dam that overlap the second power supply electrode.

According to the example embodiment of the present disclosure, in the link area of the non-display area, the first planarizing layer may not be in an area overlapping the second power supply electrode.

According to the example embodiment of the present disclosure, in the link area of the non-display area, the first dam and the second dam may overlap the second area of the first power supply electrode.

According to the example embodiment of the present disclosure, in the link area of the non-display area, the first dam and the second dam may not overlap the first area of the first power supply electrode.

According to another aspect of the present disclosure, an electroluminescence display apparatus includes a substrate including a display area and a non-display area, wherein the non-display area includes a bending area and a link area, and wherein the link area is between the display area and the bending area; a first power supply electrode in the link area of the non-display area; a second power supply electrode in the non-display area, the second power supply electrode surrounding at least three sides of the display area, and both ends of the second power supply electrode in the link area; a protective layer covering the first power supply electrode and the second power supply electrode in the link area of the non-display area; a first planarizing layer covering one side of the first power supply electrode; and a second planarizing layer on a contact hole of the protective layer that exposes the first power supply electrode and the second power supply electrode, wherein the first planarizing layer is not on the contact hole of the protective layer.

According to the example embodiment of the present disclosure, both ends of the first power supply electrode may have a first line width, and a center portion of the first power supply electrode may have a second line width that is larger than the first line width.

According to the example embodiment of the present disclosure, both ends of the second power supply electrode may face each other in the link area, one end of the first power supply electrode may be in the link area and between one end of the second power supply electrode and the display area, and the other end of the first power supply electrode may be between the other end of the second power supply electrode and the display area.

According to the example embodiment of the present disclosure, the one end of the second power supply electrode and the one end of the first power supply electrode may be spaced apart from each other in the link area, and the protective layer may be in a space formed by the one end of the second power supply electrode and the one end of the first power supply electrode that are spaced apart from each other.

According to the example embodiment of the present disclosure, the second planarizing layer may be in direct contact with an upper surface of the protective layer in the space formed by the one end of the second power supply electrode and the one end of the first power supply electrode that are spaced apart from each other.

According to the example embodiment of the present disclosure, the first power supply electrode may be formed by a lower electrode layer and an upper electrode layer on the lower electrode layer.

According to the example embodiment of the present disclosure, the first planarizing layer may cover one side of the lower electrode layer of the first power supply electrode, and the lower electrode layer may be exposed through the contact hole of the protective layer.

According to the example embodiment of the present disclosure, the upper electrode layer of the first power supply electrode may be disposed on the protective layer and may be connected to the lower electrode layer through the contact hole of the protective layer that exposes the lower electrode layer.

According to the example embodiment of the present disclosure, the upper electrode layer may cover one side of the first planarizing layer.

According to the example embodiment of the present disclosure, the lower electrode layer of the first power supply electrode may be on the same layer as the second power supply electrode and may be formed of the same material as the second power supply electrode.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protection scope of the present disclosure should be interpreted based on the following appended claims and it should be appreciated that all technical spirits included within a range equivalent thereto are included in the protection scope of the present disclosure.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. An electroluminescence display apparatus, comprising:
   a substrate including a display area and a non-display area,
   wherein the non-display area surrounds the display area and includes a pad area, a bending area, and a link area;
   a plurality of thin film transistors on the substrate in the display area;
   a first power supply electrode on the substrate in the link area of the non-display area,
   wherein the link area is between the bending area and the display area;
   a second power supply electrode on the substrate in the non-display area;
   a gate driver in the non-display area and between the second power supply electrode and the display area;
   a protective layer covering the plurality of thin film transistors, the gate driver, the first power supply electrode, and the second power supply electrode;
   a first planarizing layer covering the plurality of thin film transistors and the gate driver;
   a second planarizing layer on the first planarizing layer in the non-display area, the second planarizing layer including a first opening that exposes a surface of the first planarizing layer in an area overlapping the gate driver; and
   a plurality of light emitting elements on the second planarizing layer in the display area.

2. The electroluminescence display apparatus according to claim 1, wherein the first power supply electrode includes a first area having a first line width and a second area having a second line width that is larger than the first line width.

3. The electroluminescence display apparatus according to claim 2, wherein, in the link area of the non-display area, the first area of the first power supply electrode is between the second power supply electrode and the display area.

4. The electroluminescence display apparatus according to claim 1, wherein, in the non-display area, the protective layer includes a contact hole that exposes the second power supply electrode.

5. The electroluminescence display apparatus according to claim 4, further comprising:
   a connection electrode connected to the second power supply electrode exposed through the contact hole of the protective layer in the non-display area.

6. The electroluminescence display apparatus according to claim 5, wherein, in the non-display area, the first planarizing layer includes a second opening that exposes a surface of the protective layer in an area overlapping the second power supply electrode.

7. The electroluminescence display apparatus according to claim 3, further comprising:
   a first dam and a second dam that overlap the second power supply electrode.

8. The electroluminescence display apparatus according to claim 1, wherein, in the link area of the non-display area, the first planarizing layer is not in an area overlapping the second power supply electrode.

9. The electroluminescence display apparatus according to claim 7, wherein, in the link area of the non-display area, the first dam and the second dam overlap the second area of the first power supply electrode.

10. The electroluminescence display apparatus according to claim 9, wherein, in the link area of the non-display area, the first dam and the second dam do not overlap the first area of the first power supply electrode.

11. An electroluminescence display apparatus, comprising:
a substrate including a display area and a non-display area,
wherein the non-display area includes a bending area and a link area, and
wherein the link area is between the display area and the bending area;
a first power supply electrode in the link area of the non-display area;
a second power supply electrode in the non-display area, the second power supply electrode surrounding at least three sides of the display area, and both ends of the second power supply electrode in the link area;
a protective layer covering the first power supply electrode and the second power supply electrode in the link area of the non-display area;
a first planarizing layer covering one side of the first power supply electrode; and
a second planarizing layer on a contact hole of the protective layer that exposes the first power supply electrode and the second power supply electrode,
wherein the first planarizing layer is not on the contact hole of the protective layer.

12. The electroluminescence display apparatus according to claim 11, wherein both ends of the first power supply electrode have a first line width, and a center portion of the first power supply electrode has a second line width that is larger than the first line width.

13. The electroluminescence display apparatus according to claim 12, wherein both ends of the second power supply electrode face each other in the link area, one end of the first power supply electrode is in the link area and between one end of the second power supply electrode and the display area, and the other end of the first power supply electrode is between the other end of the second power supply electrode and the display area.

14. The electroluminescence display apparatus according to claim 13, wherein the one end of the second power supply electrode and the one end of the first power supply electrode are spaced apart from each other in the link area, and the protective layer is in a space formed by the one end of the second power supply electrode and the one end of the first power supply electrode that are spaced apart from each other.

15. The electroluminescence display apparatus according to claim 14, wherein the second planarizing layer is in direct contact with an upper surface of the protective layer in the space formed by the one end of the second power supply electrode and the one end of the first power supply electrode that are spaced apart from each other.

16. The electroluminescence display apparatus according to claim 11, wherein the first power supply electrode is formed by a lower electrode layer and an upper electrode layer on the lower electrode layer.

17. The electroluminescence display apparatus according to claim 16, wherein the first planarizing layer covers one side of the lower electrode layer of the first power supply electrode, and the lower electrode layer is exposed through the contact hole of the protective layer.

18. The electroluminescence display apparatus according to claim 17, wherein the upper electrode layer of the first power supply electrode is disposed on the protective layer and is connected to the lower electrode layer through the contact hole of the protective layer that exposes the lower electrode layer.

19. The electroluminescence display apparatus according to claim 18, wherein the upper electrode layer covers one side of the first planarizing layer.

20. The electroluminescence display apparatus according to claim 16, wherein the lower electrode layer of the first power supply electrode is on the same layer as the second power supply electrode and is formed of the same material as the second power supply electrode.

* * * * *